United States Patent
Son et al.

(10) Patent No.: US 7,199,461 B2
(45) Date of Patent: Apr. 3, 2007

(54) SEMICONDUCTOR PACKAGE SUITABLE FOR HIGH VOLTAGE APPLICATIONS

(75) Inventors: Joon-seo Son, Seoul (KR); Shi-baek Nam, Bucheon (KR); O-seob Jeon, Seoul (KR)

(73) Assignee: Fairchild Korea Semiconductor, Ltd, Bucheon (KR)

( * ) Notice: Subject to any disclaimer, the term of this patent is extended or adjusted under 35 U.S.C. 154(b) by 46 days.

(21) Appl. No.: 10/762,075

(22) Filed: Jan. 21, 2004

(65) Prior Publication Data

US 2004/0232541 A1    Nov. 25, 2004

(30) Foreign Application Priority Data

Jan. 21, 2003 (KR) .................. 10-2003-0004025

(51) Int. Cl.
  *H01L 23/52* (2006.01)
  *H01L 23/495* (2006.01)
  *H05K 7/20* (2006.01)

(52) U.S. Cl. ................. 257/692; 257/676; 361/702; 361/704; 361/712

(58) Field of Classification Search ............ 361/712, 361/723, 820, 704, 702; 257/666, 672, 674, 257/676, 678, 692, 376
See application file for complete search history.

(56) References Cited

U.S. PATENT DOCUMENTS 5,859,387 A * 1/1999 Gagnon .............. 174/52.2
5,990,501 A   11/1999 Hiyoshi et al.
6,043,111 A * 3/2000 Furuse ................ 438/123
6,255,722 B1  7/2001 Ewer et al.
6,476,481 B2  11/2002 Woodworth et al.

* cited by examiner

*Primary Examiner*—Douglas W. Owens
*Assistant Examiner*—Samuel A. Gebremariam
(74) *Attorney, Agent, or Firm*—Thomas R. FitzGerald, Esq.; Hiscock & Barclay, LLP

(57) ABSTRACT

A semiconductor package has a structure in which a leadframe pad to which a semiconductor die is attached and inner leads electrically connected to the leadframe pad are covered by a molded housing, and outer leads extending from the inner leads protrude from a side surface of the molded housing to the outside. The outer leads include a first outer lead disposed in a central portion of the molded housing, second and third outer leads respectively disposed in a right and left of the first outer lead. The second and third outer leads each have bent portions in portions where they are adjacent to the side surface of the molded housing, the bent portions protruding to increase a space between the first outer lead and the bent portions in the molded housing. At least one of the bent portions of the second and third outer leads is covered by an extended portion of the molded housing.

21 Claims, 13 Drawing Sheets

SEMICONDUCTOR PACKAGE SUITABLE FOR HIGH VOLTAGE APPLICATIONS

BACKGROUND OF THE INVENTION

This application claims the priority of Korean Patent Application No. 2003-4025, filed on Jan. 21, 2003, in the Korean Intellectual Property Office, the disclosure of which is incorporated herein in its entirety by reference.

1. Field of the Invention

The present invention relates to a semiconductor package, and more particularly, to a semiconductor package suitable for high voltage applications.

2. Description of the Related Art

Generally, semiconductor devices such as diodes, thyristors, or MOS gate devices, for example, metal-oxide-semiconductor field effect transistors (MOSFET) and insulated gate bipolar transistors (IGBT), are formed in a silicon semiconductor die including a device junction. The die includes a metal drain electrode at its lower portion, a metal source electrode, and a gate electrode. The die is attached to a surface of a leadframe pad, and electrodes are electrically connected to the leadframe by a wire bonding. Consequently, the electrodes are electrically connected to outer leads of the leadframe. The outer leads protrude out of a molded housing. The silicon semiconductor die and the wire are completely molded in the housing.

Creepage distance is the distance along a path that begins at one exposed lead, travels along the surface of the one exposed lead and the package and ends at the adjacent exposed lead. In a semiconductor package having a structure in which outer leads protrude out of a molded housing, there must be enough creepage distance to ensure a high voltage. If the creepage distance is insufficient, it is well-known in the art that the maximum application voltage of the semiconductor package is limited.

FIG. 1 is a plane view of an embodiment of a conventional semiconductor package having a structure ensuring a creepage distance as long as possible. FIGS. 2 and 3 are side views of the semiconductor package of FIG. 1.

Referring to FIGS. 1 through 3, the conventional semiconductor package 20 includes a plastic molded housing 21. The molded housing 21 completely surrounds a semiconductor die 22 which is denoted by dotted line in FIG. 2. Three outer leads 25, 26, and 27 protrude out of front side surface 28 of the molded housing 21. The above outer leads may be a gate, a source, and a drain of the MOS transistor. The outer leads 25 and 27 disposed on an edge portion include bent portions 30 and 31 which increase spaces from the outer lead 26 on a center portion. The bent portion 30 of the outer lead 25 is bent toward a direction opposite to the outer lead 26, and accordingly, the creepage distance increases. The bent portion 31 of the outer lead 27 is bent toward a direction opposite to the outer lead 26, and therefore, the creepage distance also increases.

Since the creepage distance between the outer leads can be increased, a higher voltage can be applied to the conventional semiconductor package. However, in order to ensure the longer creepage distance, side surface 28 in FIG. 3 of the molded housing, that is, a body of the package should be increased, and consequently, an entire size of the package increases.

FIG. 4 is a plane view of another embodiment of the conventional semiconductor package having the structure ensuring the maximum creepage distance. FIG. 5 shows a configuration of an inner lead in the semiconductor package in FIG. 4.

Referring to FIGS. 4 and 5, outer leads 45 and 47 of the conventional semiconductor package 40 are inclined toward directions opposite to a central outer lead 46 at the portions adjacent to a side surface 48 of the molded housing 41. Also, the molded housing has depressed structures between the outer lead 45 and the outer lead 46, and between the outer lead 47 and the outer lead 45. Inner leads 55, 56, and 57 extended from the outer leads 45, 46, and 47 and located in the molded housing 41 are connected to a leadframe pad 59 in the molded housing without any change in their structures.

In the semiconductor package having the above structure, the creepage distance 52 between the outer lead 45 and the outer lead 46 increases, and the creepage distance 53 between the outer lead 47 and the outer lead 45 also increases. However, as in the semiconductor package of FIGS. 1 through 3, the side surface 48 of the molded housing, that is, the body of the package, should be increased to obtain larger creepage distance. Consequently, the entire size of the package increases.

SUMMARY OF THE INVENTION

The present invention provides a semiconductor package suitable for high voltage applications, having a structure in which a creepage distance between outer leads is increased without increasing a size of the semiconductor package.

According to an aspect of the present invention, there is provided a semiconductor package in which a leadframe pad to which a semiconductor die is attached and inner leads electrically connected to the leadframe pad are covered by a molded housing, and outer leads extended from the inner leads protrude from a side surface of the molded housing to the outside. The outer leads include a first outer lead disposed in a central portion of the molded housing, and second and third outer leads respectively disposed in a right and left portions of the first outer lead. The second and third outer leads each have bent portions in portions where they are adjacent to the side surface of the molded housing, the bent portions protruding to increase a space between the first outer lead and the bent portions in the molded housing. Also, at least one of the bent portions of the second and third outer leads is covered by an extended portion of the molded housing.

A portion where the first outer lead is adjacent to the side surface of the molded housing may be covered by the extended portion of the molded housing. In this case, a distance between a surface of the molded housing covering the portion of the first outer lead and a surface of the molded housing covering at least one of the bent portions of the second and third outer leads may be 1 mm or more.

A depression toward a body of the molded housing may be formed on at least one of a surface of the molded housing between the first outer lead and the second outer lead and a surface of the molded housing between the first outer lead and the third outer lead.

According to an aspect of the present invention, there is provided a semiconductor package in which a leadframe pad to which a semiconductor die is attached and inner leads electrically connected to the leadframe pad are covered by a molded housing, and outer leads extended from the inner leads protrude from a side surface of the molded housing to the outside. The outer leads include a first outer lead disposed in a central portion of the molded housing, second and third outer leads respectively disposed in a right and left of the first outer lead. The second and third outer leads each include inclinations in which a distance between the first outer lead and the inclinations becomes larger as a distance between the inclinations and the side surface of the molded housing becomes smaller. And at least one of the inclinations of the second and third outer leads is covered by an extended portion of the molded housing.

A portion where the first outer lead is adjacent to the side surface of the molded housing may be covered by the extended portion of the molded housing. In this case, a distance between a surface of the molded housing covering the portion of the first outer lead and a surface of the molded housing covering at least one of the inclinations of the second and third outer leads may be 1 mm or more.

A depression toward a body of the molded housing may be formed on at least one of a surface of the molded housing between the first outer lead and the second outer lead and a surface of the molded housing between the first outer lead and the third outer lead.

At least one of the inclinations of the second and third outer leads may include a portion which is perpendicular to a surface of the molded housing and a flat portion which is larger than a thickness of the molded housing covering the inclinations in a boundary between the inclinations and the molded housing.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
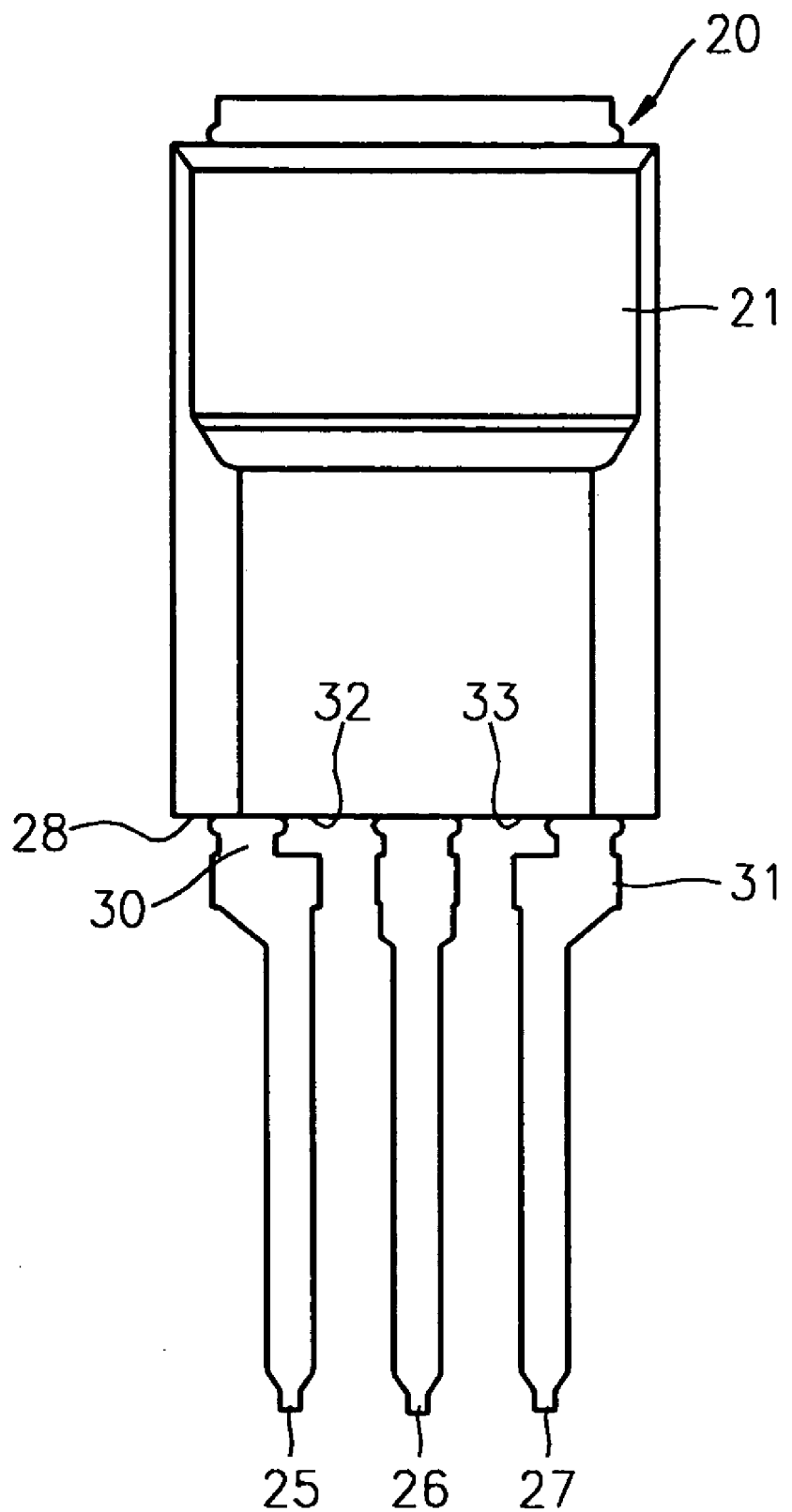
FIG. 1 is a plane view of an embodiment of a conventional semiconductor package.
Figure 2:
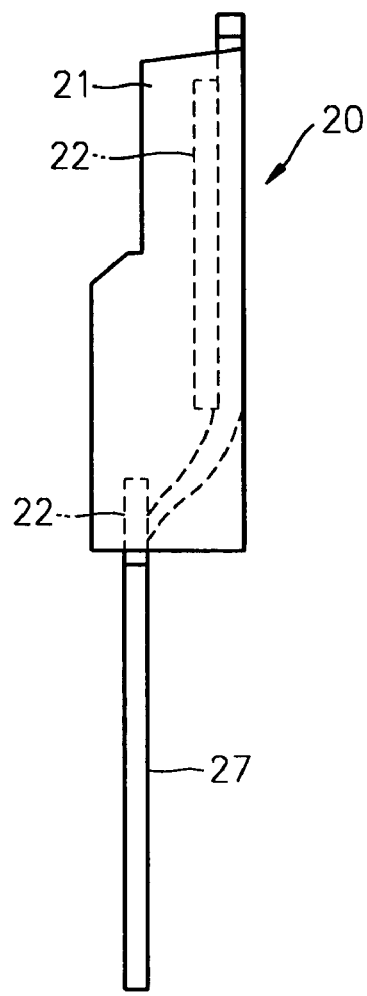
FIG. 2 is a side view of the semiconductor package of FIG. 1.
Figure 3:
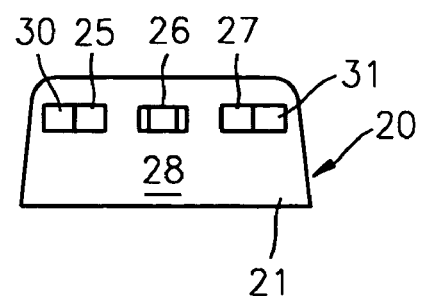
FIG. 3 is another side view of the semiconductor package of FIG. 1.
Figure 4:
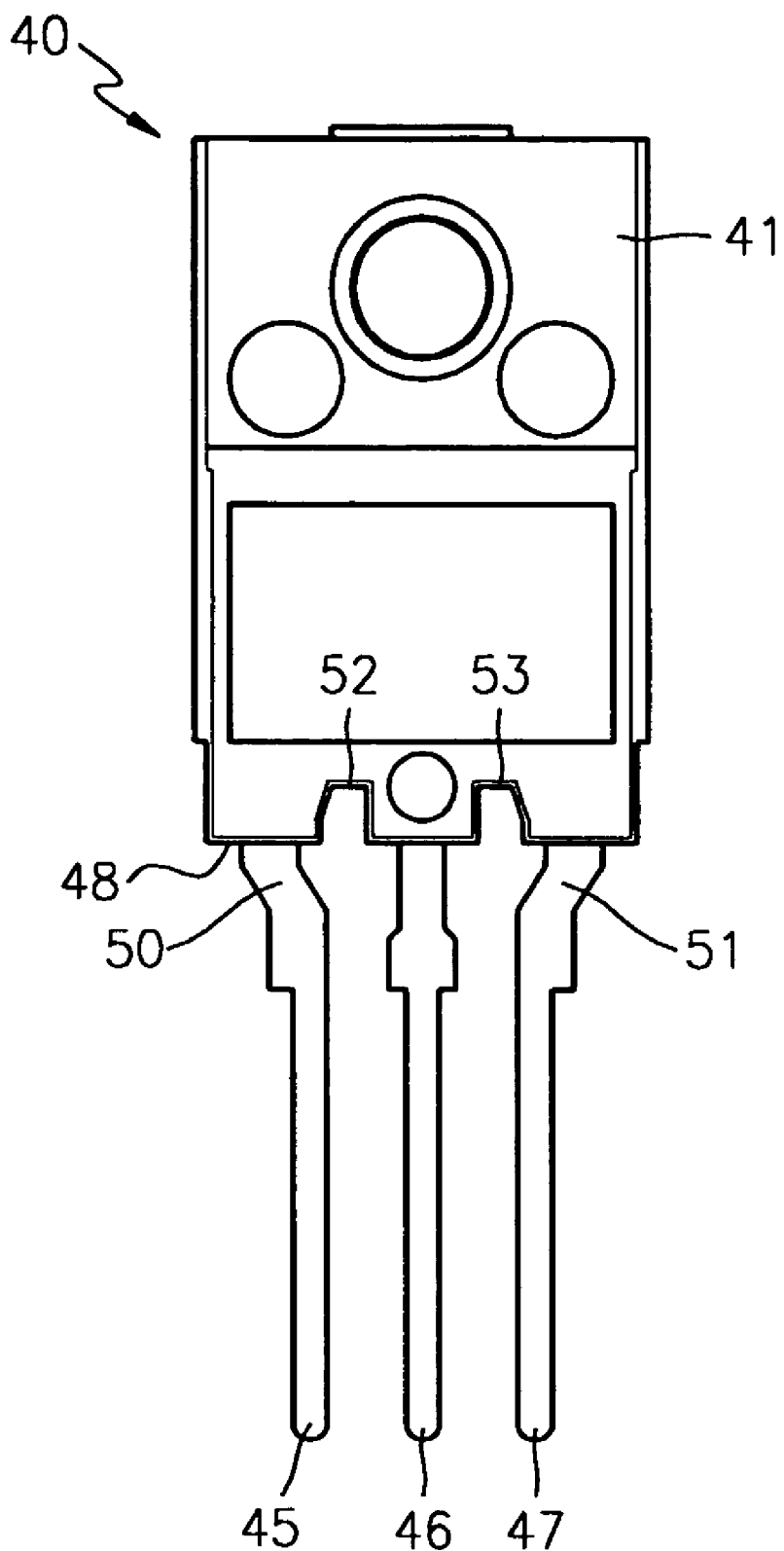
FIG. 4 is a plane view of another embodiment of the conventional semiconductor package.
Figure 5:
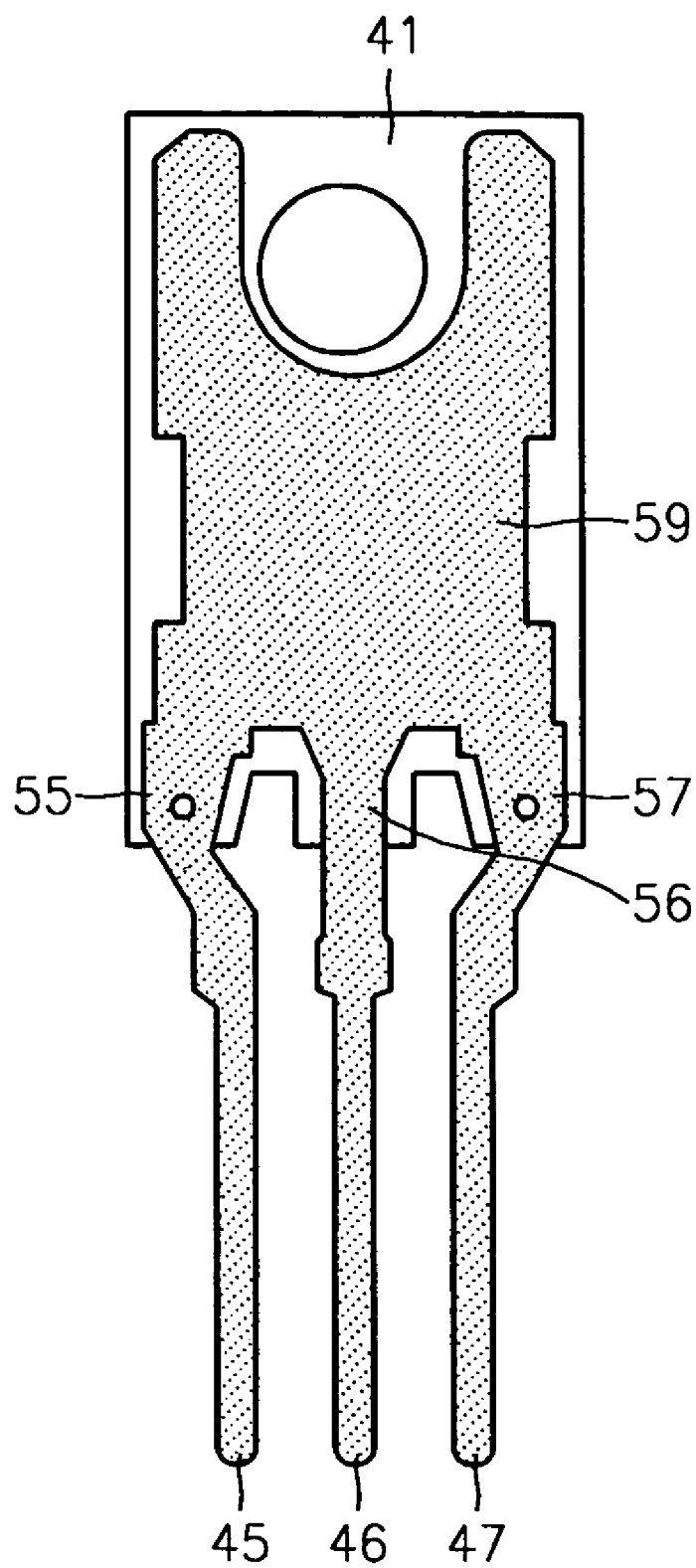
FIG. 5 is a view of a configuration of an inner lead in the semiconductor package of FIG. 4.
Figure 6:
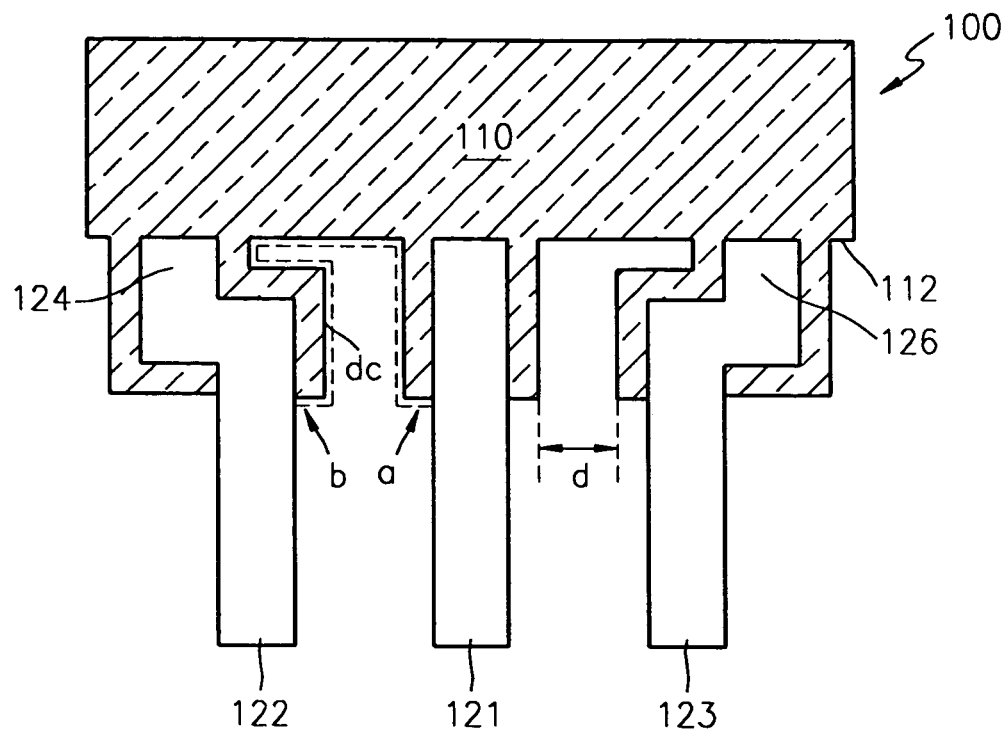
FIG. 6 is a plane view of an embodiment of a semiconductor package according to the present invention.

FIG. 6 is a plane view of an embodiment of a semiconductor package according to the present invention. Referring to FIG. 6, the semiconductor package 100 according to the present invention has a structure in which three outer leads 121, 122 and 123 protrude out of a molded housing 110. Among those three outer leads 121, 122 and 123, a first outer lead 121 is disposed in a central portion of a side surface 112 of the molded housing 110. A second outer lead 122 and a third outer lead 123 are disposed on edge portions on the side surface 112 of the molded housing 110 to be respectively separated from the first outer lead 121 by a predetermined distance. Although it is not shown in FIG. 6, a semiconductor device such as metal-oxide-semiconductor field effect transistor (MOSFET) is buried in the molded housing 110, and respective electrodes of the semiconductor device are electrically connected to inner leads (not shown) which are extended from the outer leads 121, 122 and 123 via wires (not shown) in the molded housing.

The second and third outer leads 122 and 123 disposed at the edge portion include bent portions 124 and 126 protruding toward directions opposite to the first outer lead 121 in portions adjacent to the molded housing 110. That is, a surface of the second outer lead 122 facing the first outer lead 121 is depressed to be apart from the first outer lead 121 on one side surface 112 of the molded housing 110, and accordingly, the second outer lead 122 protrudes from the surface opposing the above surface of the second outer lead 122. A surface of the third outer lead 123 facing the first outer lead 121 is depressed to be apart from the first outer lead 121 on one side surface 112 of the molded housing 110, and accordingly, the third outer lead 123 protrudes from the surface opposing the above surface of the third outer lead 123.

The bent portions 124 and 126 of the second and third outer leads 122 and 123 are covered by the molded housing 110. Also, a portion of the first outer lead 121 is covered by the molded housing 110. That is, the molded housing 110 extends at some parts thereof so as to cover a portion of the first outer lead 121 and the bent portions 124 and 126 of the second and third outer leads 122 and 123. The thickness of the molded housing 110 covering a part of the first outer lead 121 and the bent portions 124 and 126 is not necessarily thick, but it is appropriate that the thickness of the molded housing 110 is relatively thin. A distance (d) between a surface of extended portion of the molded housing 110 covering the first outer lead 121 and a surface of extended portion of the molded housing 110 covering the bent portion 126 of the third outer lead 123 is about 1 mm or more.

In the semiconductor package 100 having the above described structure, the creepage distance ($d_c$) (as shown by the dotted line) between the first outer lead 121 and the second outer lead 122 is a surface distance of the molded housing 110 measured from a first point (a) of the first outer lead 121 to a second point (b) of the second outer lead 122. Therefore, the semiconductor package is capable of ensuring a creepage distance larger than that of the conventional semiconductor package as long as the length of extended portion of the molded housing 110 covering the surface of the bent portion 124 of the second outer lead 122. The creepage distance between the first outer lead 121 and the third outer lead 123 also increases. In the semiconductor package 100 according to the present embodiment, a size of the semiconductor package does not increase in spite of the increase of creepage distance ($d_c$). This is because the increase of the creepage distance ($d_c$) is achieved using a structure in which a portion of the molded housing 110 extends to cover the bent portions 124 and 126 of the second and third outer leads 122 and 123.

Figure 7:
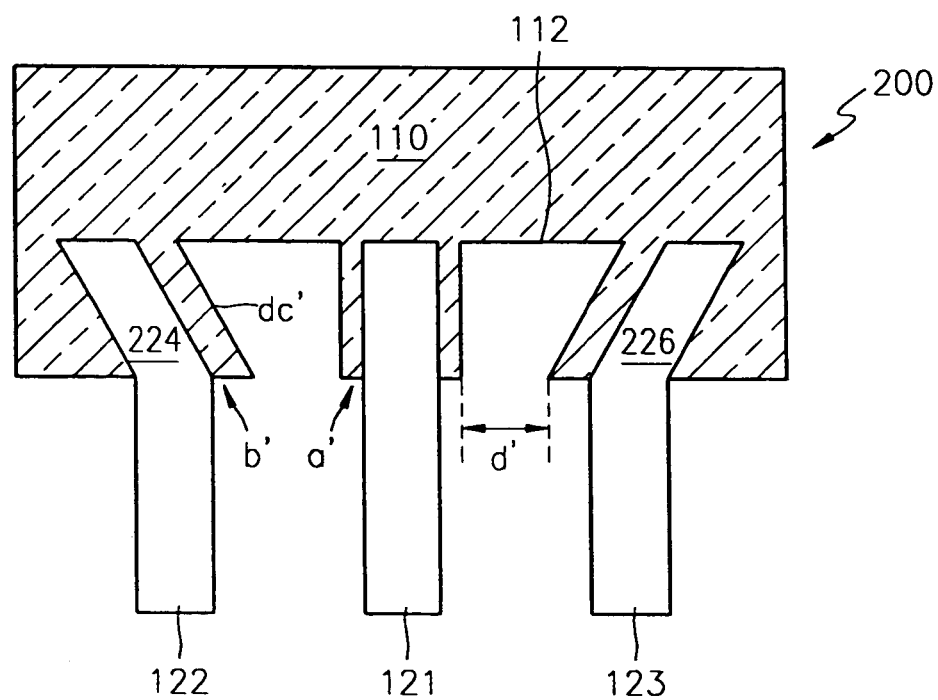
FIG. 7 is a plane view of another embodiment of the semiconductor package according to the present invention.

FIG. 7 is a plane view of another embodiment of the semiconductor package according to the present invention. In FIG. 7, same reference numerals as those of FIG. 6 denote the same elements, and therefore, explanations thereof are omitted.

Referring to FIG. 7, the second and third leads 122 and 123 disposed on the edge portions of the semiconductor package 200 respectively include inclinations 224 and 226 so that a distance between the first outer lead 121 and the inclinations 224 and 226 becomes larger as a distance between the inclinations 224 and 226 and the side surface 112 of the molded housing 110 becomes smaller. That is, the largest distance between the second outer lead 122 and the first outer lead 121 is between an upper left corner of the second outer lead and an upper left corner of the first outer lead 121, and the largest distance between the second outer lead 122 and the first outer lead 121 is between an upper right corner of the second outer lead 122 and an upper right corner of the first outer lead 121.

The inclinations 224 and 226 of the second and third outer leads 122 and 123 are covered by the molded housing 110. Also, a portion of the first outer lead 121 is covered by the molded housing 110. That is, the molded housing 110 extends so as to cover the portion of the first outer lead 121 and the inclinations 224 and 226 of the second and third leads 122 and 123. The thickness of the molded housing 110 covering the portion of the first outer lead 121 and the inclinations 224 and 226 is relatively small. An interval (d') between a surface of extended portion of the molded housing 110 covering the first outer lead 121 and a surface of extended portion of the molded housing 110 covering the inclination 226 of the third outer lead 123 is about 1 mm or more.

In the semiconductor package 200 having the above described structure, the creepage distance ($d_c'$) between the first outer lead 121 and the second outer lead 122 is the surface distance from a first point (a') of the first outer lead 121 to a second point (b') of the second outer lead 122. Therefore, a length corresponding to the extended portion of the molded housing 110 covering a surface of the inclination 224 of the second outer lead 122 can be ensured as the creepage distance longer than that of the conventional art. The creepage distance between the first outer lead 121 and the third outer lead 123 also increases. In the semiconductor package 200 according to the present embodiment, a size of the semiconductor package 200 does not increase in spite of the increase of the creepage distance ($d_c'$). This is because that the increase of the creepage distance ($d_c'$) can be achieved by extending a part of the molded housing 110 so as to cover the inclinations 224 and 226 of the second and third outer leads 122 and 123.

FIGS. 8A through 8G are views of various modifications of the semiconductor package in FIG. 6. Same reference numerals in FIGS. 8A through 8G as those of FIG. 6 denote the same elements.

Figure 8A:
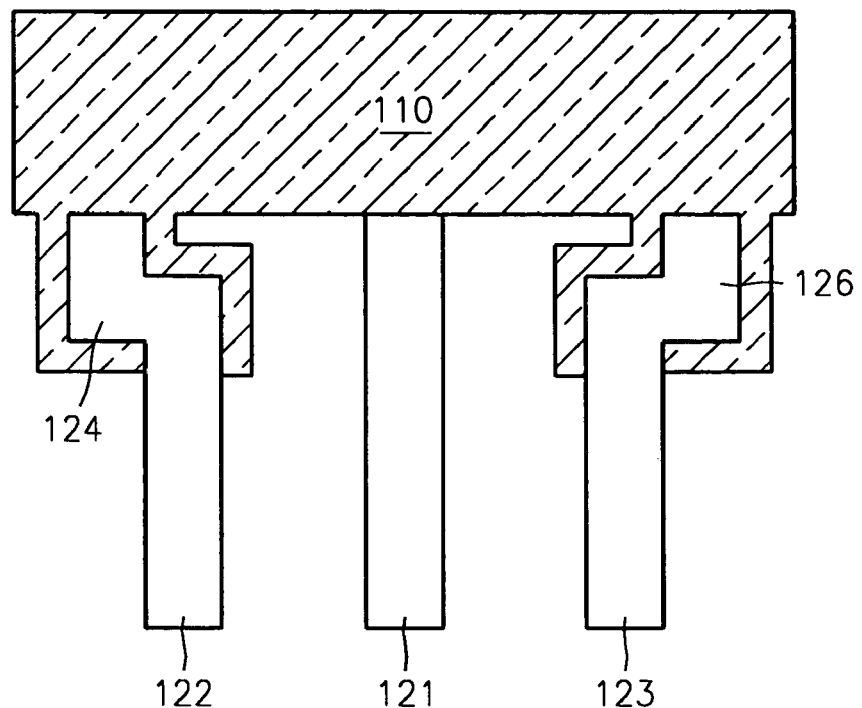
FIGS. 8A through 8G are views illustrating various modifications of the semiconductor package of FIG. 6.

In the semiconductor package in FIG. 8A, the extended portion of the molded housing 110 covering a portion of the first outer lead 121 is removed, and consequently, the first outer lead 121 is completely exposed out of the molded housing 110. Thus, the semiconductor package in FIG. 8A has reduced creepage distance, however, it becomes easier to fabricate the semiconductor package of FIG. 8A than to fabricate the semiconductor package of FIG. 6.

Figure 8B:
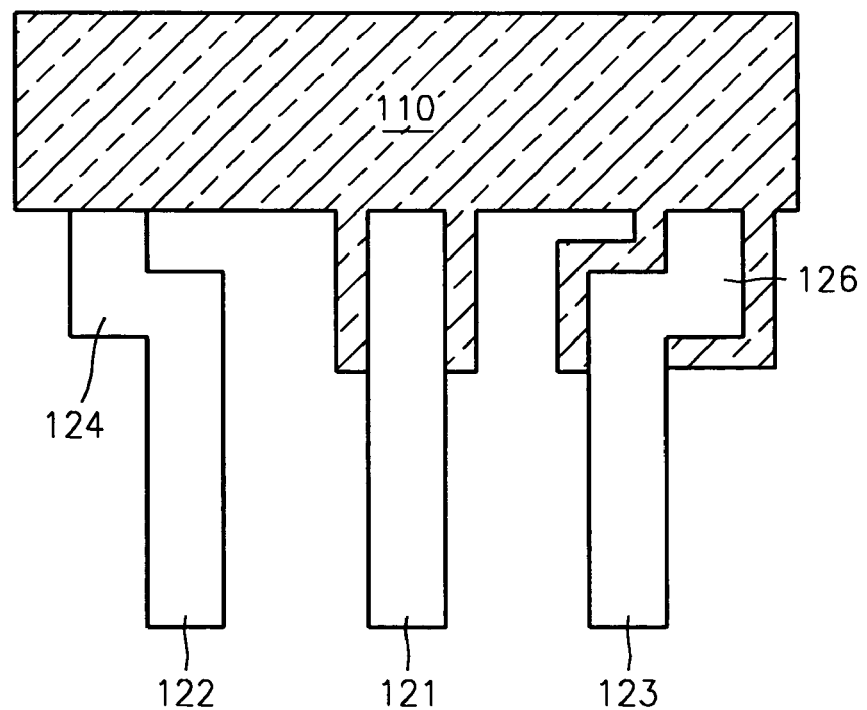

In the semiconductor package of FIG. 8B, the extended portion of the molded housing 110 covering the bent portion 124 of the second outer lead 122 is removed, thus completely exposing the bent portion 124 of the second outer lead 122 out of the molded housing 110. Therefore, the semiconductor package of FIG. 8B has the same creepage distance between the first outer lead 121 and the third outer lead 123 as that of the semiconductor package of FIG. 6, however, the creepage distance between the first outer lead 121 and the second outer lead 122 becomes smaller than that of the semiconductor package of FIG. 6. Thus, the semiconductor package of FIG. 8B is suitable for a case where a relatively high voltage should be applied between the first outer lead 121 and the third outer lead 123.

Figure 8C:
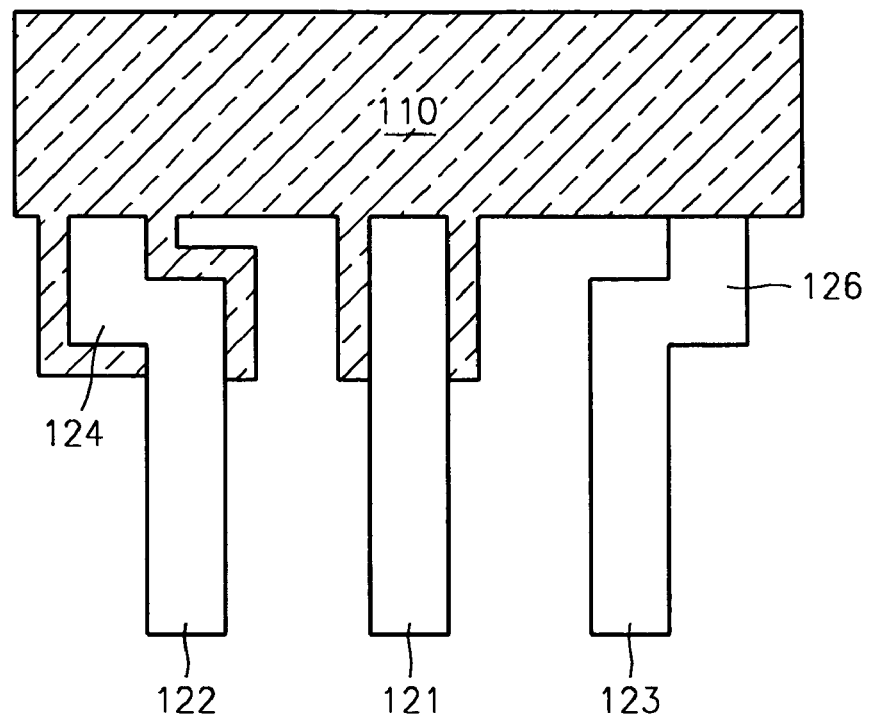

The semiconductor package of FIG. 8C is same as that of FIG. 8B, however, the extended portion of the molded housing 110 covering the bent portion 126 of the third outer lead 123 is removed instead of removing that on the bent portion 124 of the second outer lead 122. Therefore, in the semiconductor package of FIG. 8C, the creepage distance between the first outer lead 121 and the second outer lead 122 can be maintained to be same as that of the semiconductor package 100 of FIG. 6. However, the creepage distance between the first outer lead 121 and the third outer lead 123 becomes smaller than that of the semiconductor package of FIG. 6. Thus, the semiconductor package of FIG. 8C is suitable for a case where a relatively high voltage should be applied between the first outer lead 121 and the second outer lead 122.

Figure 8D:
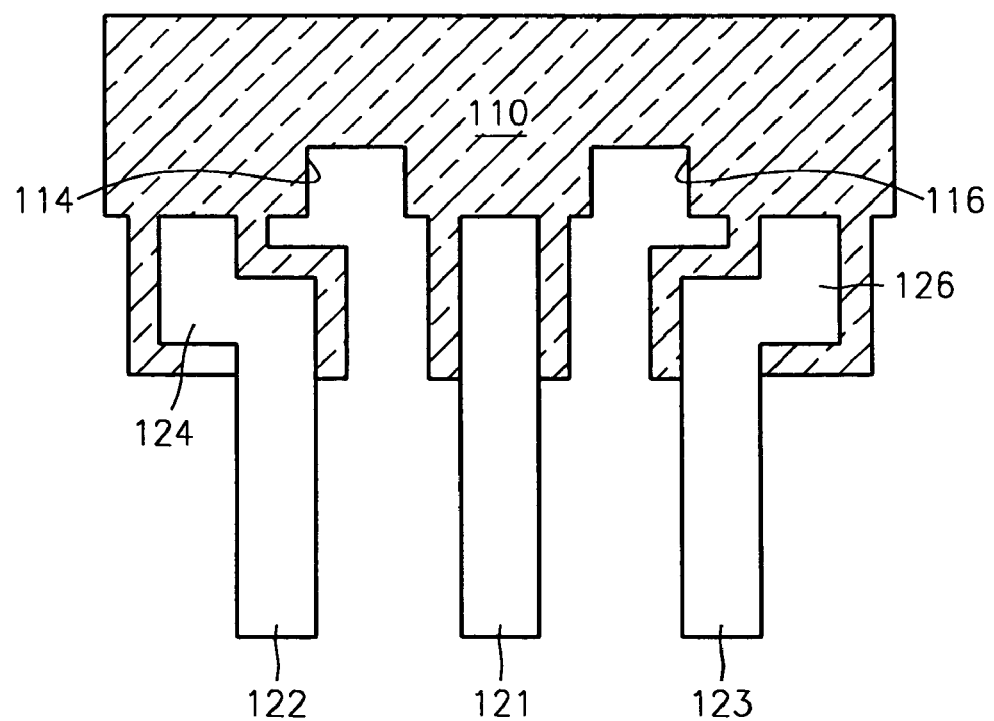

The semiconductor package of FIG. 8D has same structure as that of the semiconductor package 100 of FIG. 6 except that grooves 114 and 116 are formed on a surface of the molded housing 110 between the first outer lead 121 and the second outer lead 122 and on a surface of the molded housing 110 between the first outer lead 121 and the third outer lead 123. The grooves 114 and 116 increase the creepage distance between the first outer lead 121 and the second outer lead 122 and the creepage distance between the first outer lead 121 and the third outer lead 123 as much as the surface distances of the grooves 114 and 116.

Figure 8E:
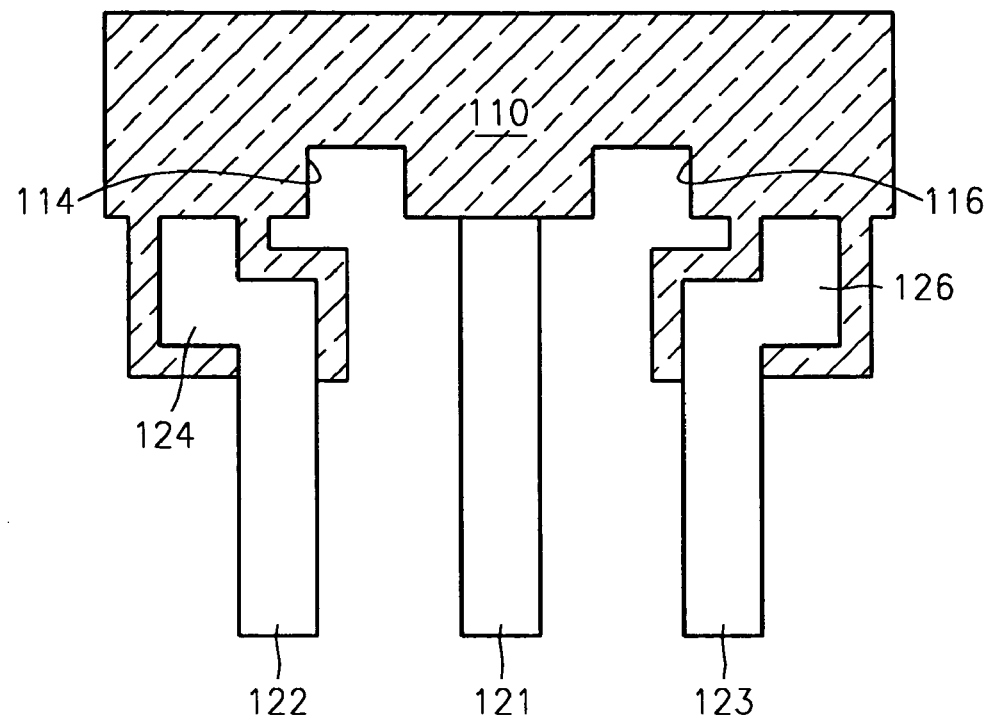

The semiconductor package in FIG. 8E has same structure as that of FIG. 8D, but is different in that the extended portion of the molded housing 110 covering a portion of the first outer lead 121 is removed. Therefore, the first outer lead 121 in the semiconductor package of FIG. 8E is completely exposed out of the molded housing 110. Although the semiconductor package of FIG. 8E has the creepage distance shorter than that of the semiconductor package of FIG. 8D, it becomes easier to fabricate the semiconductor package of FIG. 8E than to fabricate the semiconductor package of FIG. 8D.

Figure 8F:
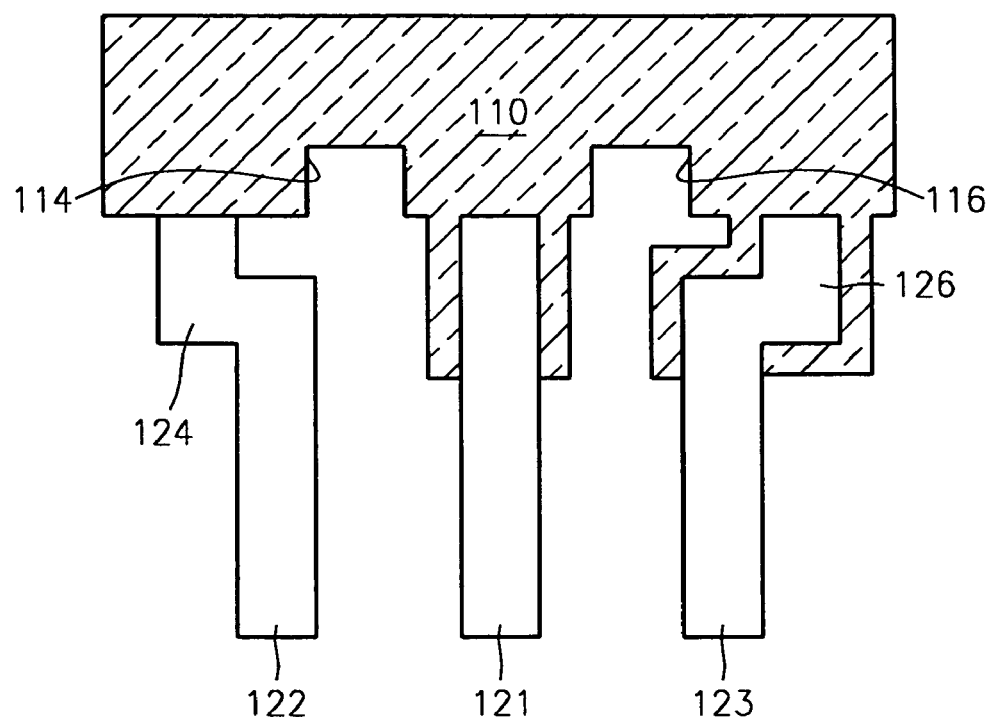

In the semiconductor package of FIG. 8F, the extended portion of the molded housing 110 covering the bent portion 124 of the second outer lead 122 when it is compared to the semiconductor package of FIG. 8D, and consequently, the bent portion 124 of the second outer lead 122 is completely exposed out of the molded housing 110. Therefore, the semiconductor package of FIG. 8F has same creepage distance between the first outer lead 121 and the third outer lead as that of the semiconductor package of FIG. 8D, but has smaller creepage distance between the first outer lead 121 and the second outer lead 122 than that of the semiconductor package of FIG. 8D. The semiconductor package of FIG. 8F is suitable for a case where a relatively high voltage should be applied between the first outer lead 121 and the third outer lead 123.

Figure 8G:
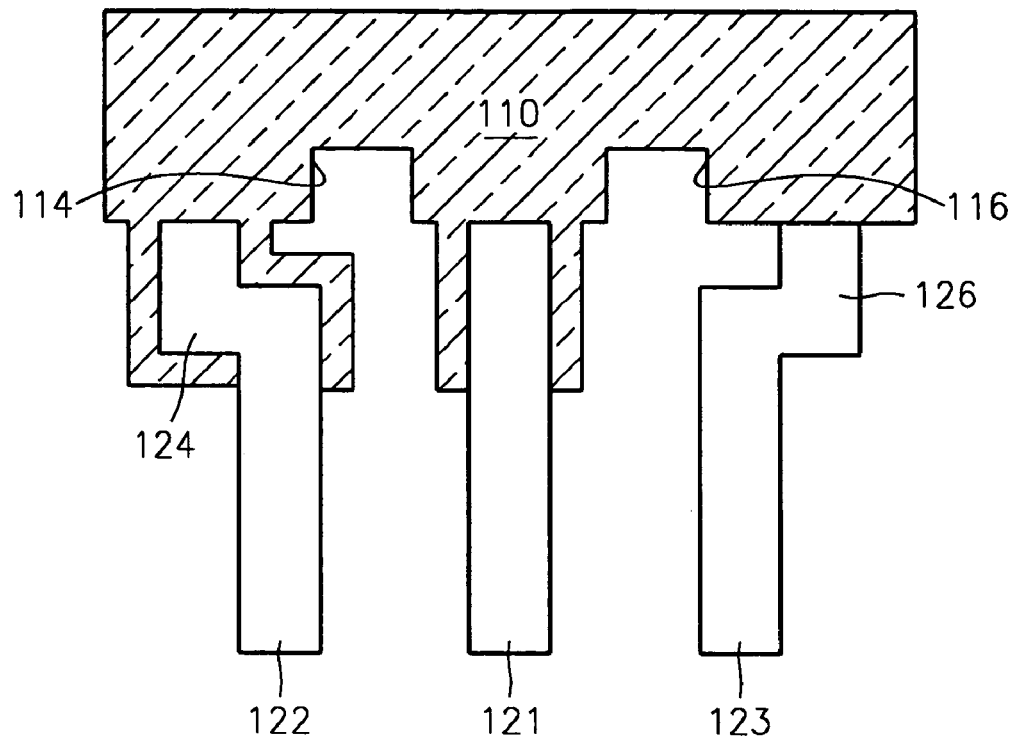

The semiconductor package of FIG. 8G is same as that of FIG. 8F except that the extended portion of the molded housing 110 covering the bent portion 126 of the third outer lead 123 is removed, instead of removing the protrusion 124 of the second outer lead 122. Therefore, the semiconductor package of FIG. 8G has same creepage distance between the first outer lead 121 and the second outer lead 122 as that of the semiconductor package of FIG. 8D, but has smaller creepage distance between the first outer lead 121 and the third outer lead 123 than that of the semiconductor package of FIG. 8D. The semiconductor package of FIG. 8G is suitable for a case where a relatively high voltage should be applied between the first outer lead 121 and the second outer lead 122.

FIGS. 9A through 9G are views of various modifications of the semiconductor package of FIG. 7. Same reference numerals of FIGS. 9A through 9G as those of FIG. 7 denote the same elements.

Figure 9A:
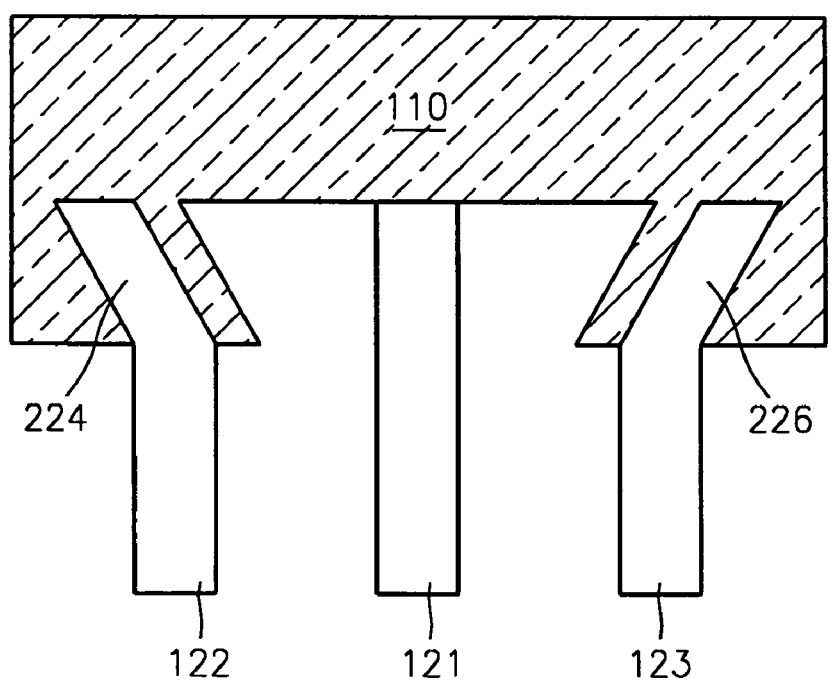
FIGS. 9A through 9G are views illustrating various modifications of the semiconductor package of FIG. 7.

In the semiconductor of FIG. 9A, the extended portion of the molded housing 110 covering a portion of the first outer lead 121 is removed, thus completely exposing the first outer lead 121 out of the molded housing 110. Therefore, the semiconductor package of FIG. 9A has reduced creepage distance, however, it becomes easier to fabricate the semiconductor package of FIG. 9A than to fabricate the semiconductor package of FIG. 7.

Figure 9B:
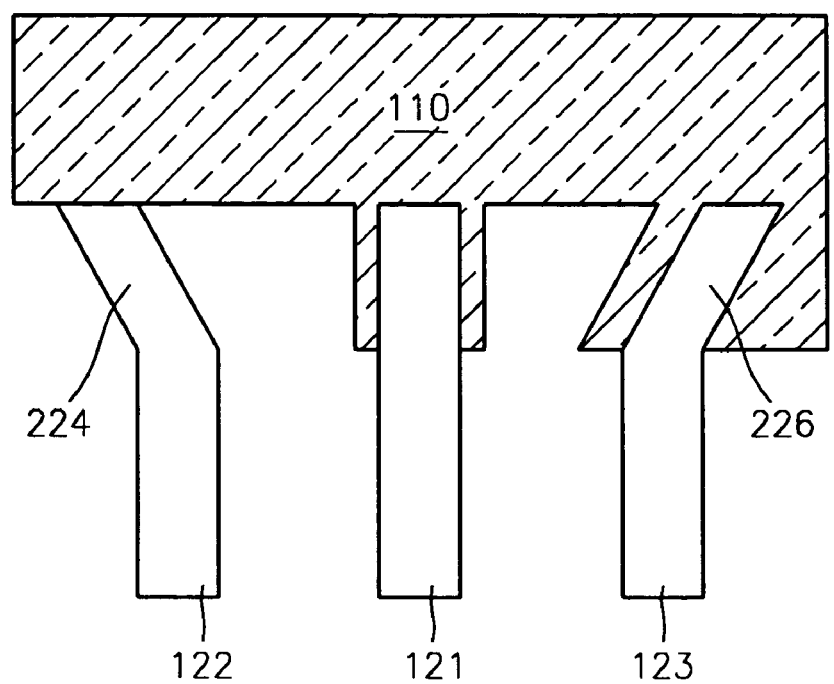

In the semiconductor package of FIG. 9B, the extended portion of the molded housing 110 covering the inclination 224 of the second outer lead 122 is removed, thus completely exposing the inclination 224 of the second outer lead 122 out of the molded housing 110. Therefore, the semiconductor package of FIG. 9B has same creepage distance between the first outer lead 121 and the third outer lead 123 as that of the semiconductor package of FIG. 7. However the creepage distance between the first outer lead 121 and the second outer lead 122 becomes smaller than that of the semiconductor package 200 of FIG. 7. The semiconductor package of FIG. 9B is suitable for a case where a relatively high voltage should be applied between the first outer lead 121 and the third outer lead 123.

Figure 9C:
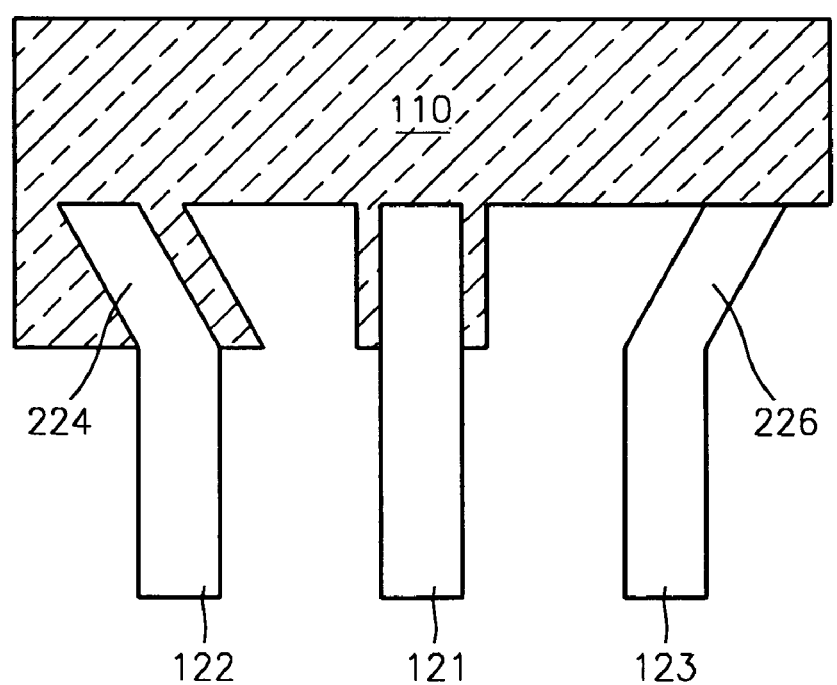

The semiconductor package of FIG. 9C has same structure as that of the semiconductor package of FIG. 9B except that the extended portion of the molded housing 110 covering the inclination 226 of the third outer lead 123 is removed. The semiconductor package of FIG. 9C has same creepage distance between the first outer lead 121 and the second outer lead 122 as that of the semiconductor package 200 of FIG. 7, but has shorter creepage distance between the first outer lead 121 and the third outer lead 123 than that of the semiconductor package 200 of FIG. 7. The semiconductor package of FIG. 9C is suitable for a case where a relatively high voltage should be applied between the first outer lead 121 and the second outer lead 122.

Figure 9D:
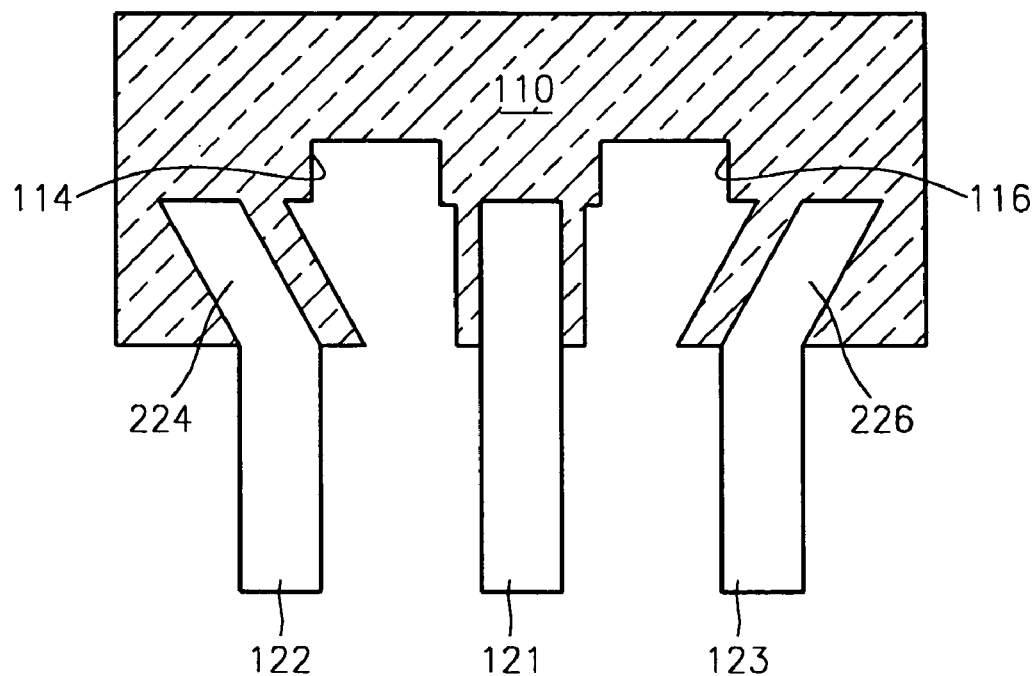

The semiconductor package of FIG. 9D has same structure as that of the semiconductor package of FIG. 7 except that grooves 114 and 116 are formed on a surface of the molded housing 110 between the first outer lead 121 and the second outer lead 122 and on a surface of the molded housing 110 between the first outer lead 121 and the third outer lead 123. The grooves 114 and 116 increase the creepage distance between the first outer lead 121 and the second outer lead 122 and the creepage distance between the first outer lead 121 and the third outer lead 123 as much as the surface distances of the grooves 114 and 116.

Figure 9E:
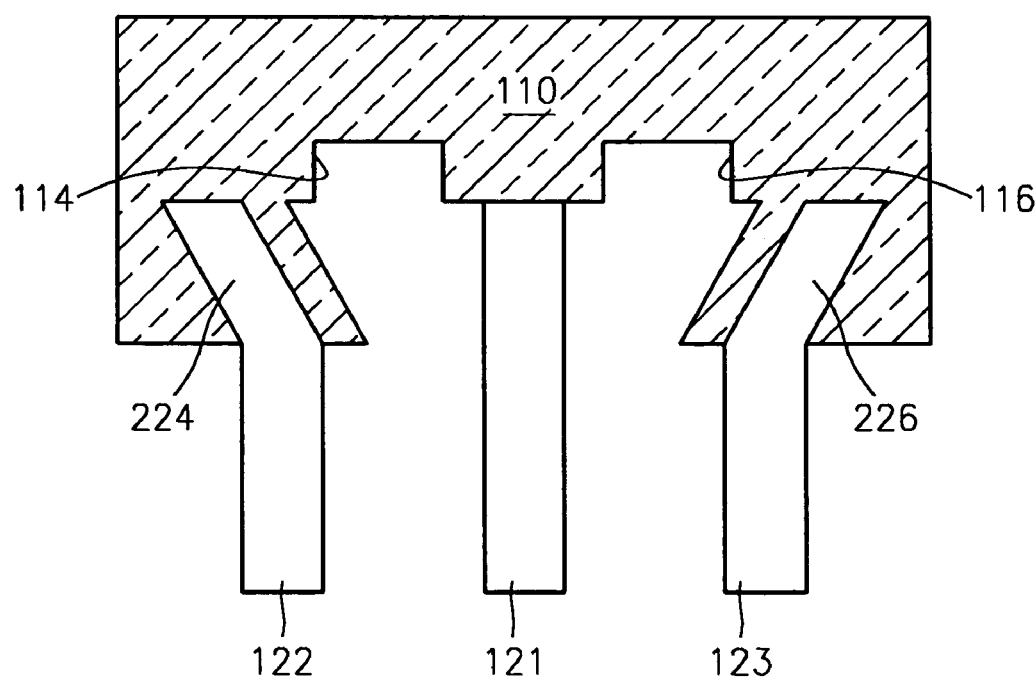

The semiconductor package of FIG. 9E has same structure as that of the semiconductor package of FIG. 9D except that the extended portion of the molded housing 110 covering a portion of the first outer lead 121 is removed. Thus, the first outer lead 121 of the semiconductor package of FIG. 9E is completely exposed out of the molded housing 110. Although the creepage distance is shorter than that of the semiconductor package of FIG. 9D, it becomes easier to fabricate the semiconductor package of FIG. 9E than to fabricate the semiconductor package of FIG. 9D.

Figure 9F:
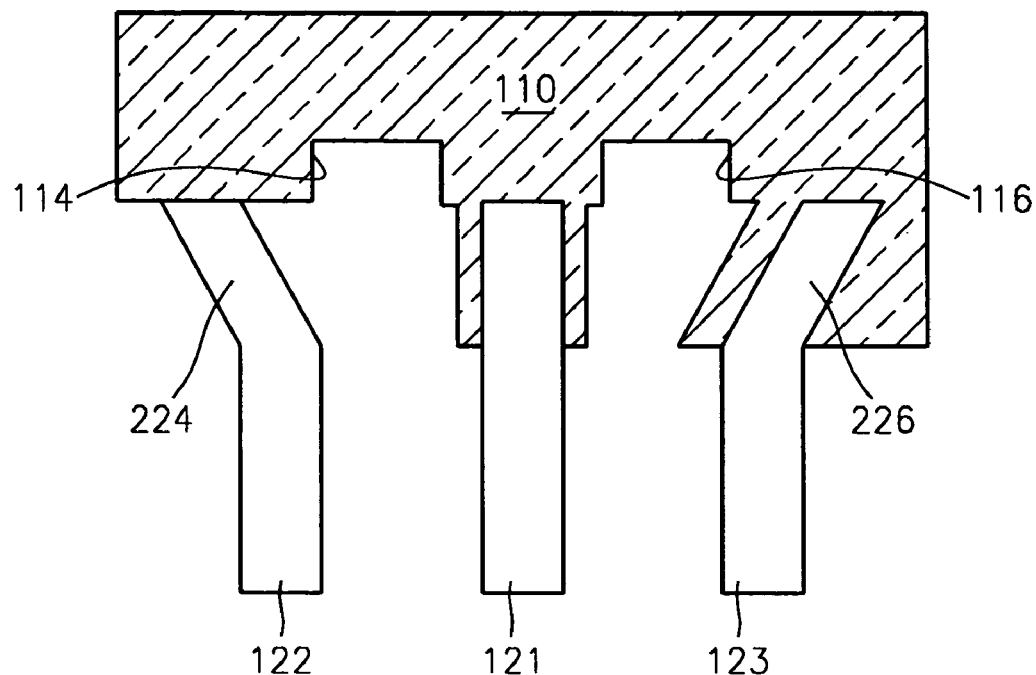

In the semiconductor package of FIG. 9F, the extended portion of the molded housing 110 covering the inclination 224 of the second outer lead 122 is removed. Consequently, the inclination 224 of the second outer lead 122 is completely exposed out of the molded housing 110. Thus, the semiconductor package of FIG. 9F has same creepage distance between the first outer lead 121 and the third outer lead 123 as that of the semiconductor package of FIG. 9D, however, has shorter creepage distance between the first outer lead 121 and the second outer lead 122 than that of the semiconductor package of FIG. 9D. Therefore, it is suitable for a case where a relatively high voltage should be applied between the first outer lead 121 and the third outer lead 123.

Figure 9G:
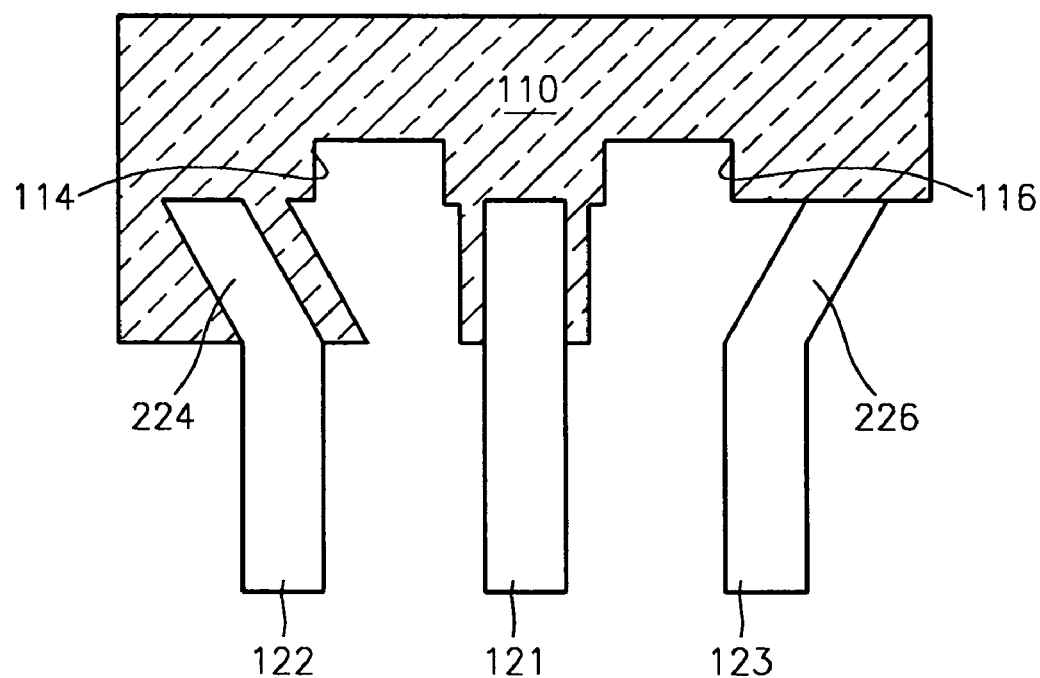

The semiconductor package of FIG. 9G has same structure as that of the semiconductor package of FIG. 9F except that the extended portion of the molded housing 110 covering the inclination 226 of the third outer lead 123 is removed instead of removing the inclination 224 of the second outer lead 122. The semiconductor package of FIG. 9G has same creepage distance between the first outer lead 121 and the second outer lead 122 as that of the semiconductor package of FIG. 9D. However, the creepage distance between the first outer lead 121 and the third outer lead 123 becomes smaller than that of the semiconductor package of FIG. 9G. The semiconductor package of FIG. 9G is suitable for a case where a relatively high voltage should be applied between the first outer lead 121 and the second outer lead 122.

Figure 10:
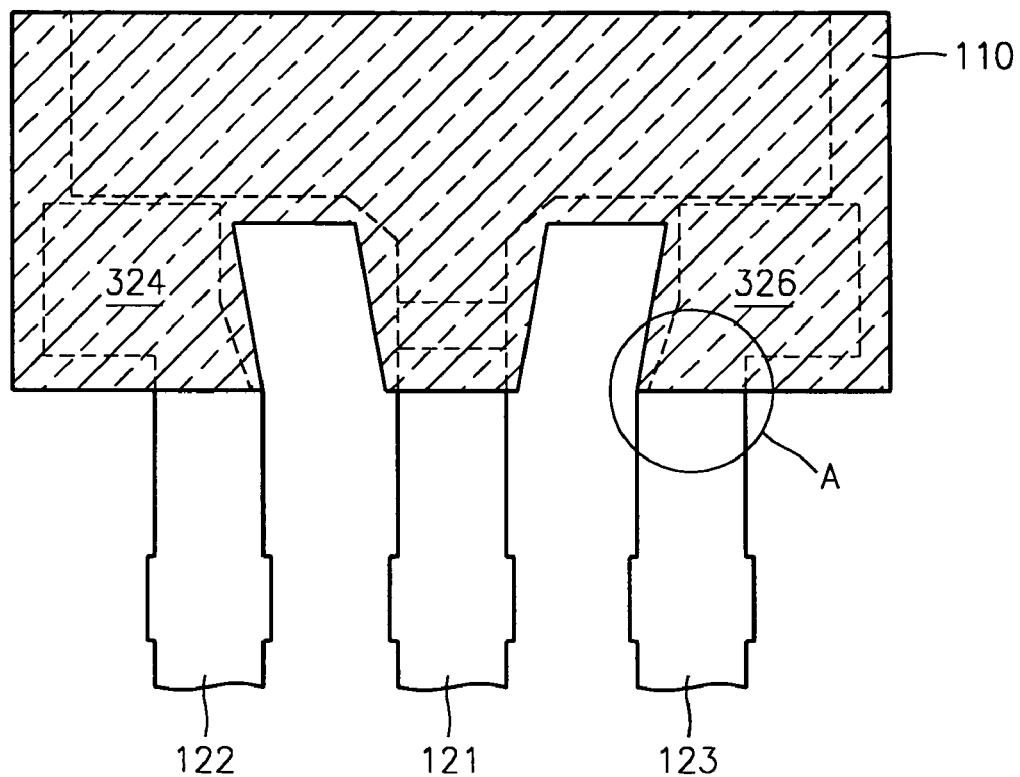
FIG. 10 is a view showing another modification of the semiconductor package of FIG. 7, in which a pitch between outer leads is not changed.
Figure 11:
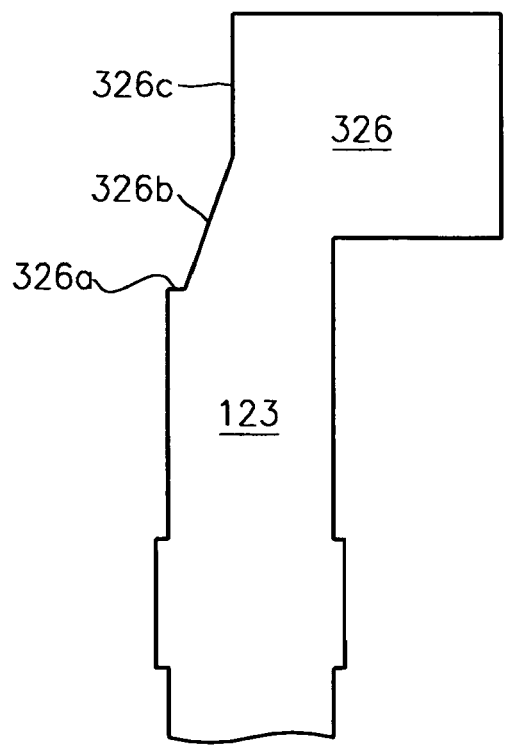
FIG. 11 is an enlarged view of a third outer lead in a portion A of FIG. 10.

FIG. 10 is a view of a structure restraining the pitch between outer leads from changing by modifying the semiconductor package of FIG. 7. In addition, FIG. 11 is a view of enlarged third outer lead in part A of FIG. 10. Same reference numerals of FIGS. 10 and 11 as those of FIG. 7 denote the same elements.

Referring to FIGS. 10 and 11, the semiconductor package has nearly same structure as that of the semiconductor package 200 of FIG. 7, but is different from the semiconductor package of FIG. 7 in configurations of inclination 324 of the second outer lead 122 and inclination 326 of the third outer lead 123. More particularly, in the inclination 326 of the third outer lead 123, a flat portion 326a, an inclined portion 326b and a perpendicular portion 326c are disposed on the surface facing the first outer lead 121 sequentially toward the molded housing 110. The inclined portion 326b and the perpendicular portion 326c increase the creepage distance between the first outer lead 121 and the third outer lead 123, and the flat portion 326a restrains the pitch between the first outer lead 121 and the third outer lead 123 from being reduced. That is, since the inclination 326 of the third outer lead 123 is covered by the molded housing 110, the pitch between the first outer lead 121 and the third outer lead 123 is reduced as much as the thickness of the molded housing 110. However, when the flat portion 326a is included as in the present embodiment, the molded housing 110 is capable of covering the inclination 326 within the range of the flat portion 326a. Accordingly, the pitch between the first outer lead 121 and the third outer lead 123 is not reduced. The second outer lead 122 has same structure as that of the third outer lead 123, and detailed description is omitted.

As described above, according to the semiconductor package of the present invention, the bent portion or the inclination is formed on some parts of the outer leads which connect with a side surface of the molded housing, and the extended portion of the molded housing is covered thereon to increase the creepage distances between outer leads. Accordingly, rated voltage applicable to the outer leads of the semiconductor package can be increased, thus providing the structure suitable to the high voltage application.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A packaged semiconductor device comprising:
    a semiconductor die;
    a leadframe pad for supporting the semiconductor die;
    a molded housing encapsulating the leadframe pad and semiconductor die;
    a plurality of elongated leads each having an inner portion extending from a first end inside the molded housing, protruding through a side surface of the molded housing and terminating at a second end outside the housing to form an outer portion of each lead,
    wherein a second lead is opposite to a third lead, wherein a first lead is disposed between the opposing second lead and third lead,
    wherein the second and third leads each have a bent region along their respective lengths, said bent regions being adjacent to the side surface of the molded housing, the bent region formed to increase a space between the first outer lead and the second and third leads,
    wherein the molded housing outside the side surface is formed entirely on at least one of the bent regions of the second and third leads, the molded housing formed on the bent region having a inner wall on the contour of the bent region, an outer wall spaced from the inner wall following the contours of the bent region, and an end wall.

2. The semiconductor package of claim 1, wherein a distance between a surface of the molded housing covering the portion of the first outer lead and a surface of the molded housing covering the bent region of the second and third outer leads is 1 mm or more.

3. The semiconductor package of claim 1, wherein a depression which is depressed toward a body of the molded housing is formed on at least one of a surface of the molded housing between the first outer lead and the second outer lead and a surface of the molded housing between the first outer lead and the third outer lead.

4. A semiconductor package in which a leadframe pad to which a semiconductor die is attached and inner leads electrically connected to the leadframe pad are covered by a molded housing, and outer leads extended from the inner leads protrude from a side surface of the molded housing to the outside,
    wherein a second lead is opposite to a third lead,
    wherein a first lead is disposed between the opposing second and third leads,
    wherein the second and third leads each have a bent region along their respective lengths, said bent regions being adjacent to the side surface of the molded housing, the bent regions formed to increase a space between the first outer lead and the bent regions of the second and third leads,
    wherein the molded housing is formed entirely on at least one of the bent regions of the second and third leads, the molded housing formed on the bent region having an inner wall on the contour of the bent region, an outer wall spaced from the inner wall following the contours of the bent region, and an end wall.

5. The semiconductor package of claim 4, wherein a portion where the first outer lead is adjacent to the side surface of the molded housing and is covered by the extended portion of the molded housing.

6. The semiconductor package of claim 5, wherein a distance between a surface of the molded housing covering the portion of the first outer lead and a surface of the molded housing covering the bent regions of the second and third outer leads is 1 mm or more.

7. The semiconductor package of claim 4, wherein a depression which is depressed toward a body of the molded housing is formed on at least one of a surface of the molded housing between the first outer lead and the second outer lead and a surface of the molded housing between the first outer lead and the third outer lead.

8. The semiconductor package of claim 4, wherein the second and third outer leads have an inclination portion, wherein at least one of the inclination portions of the second and third outer leads includes a portion which is perpendicular to a surface of the molded housing and a flat portion which is larger than a thickness of the molded housing covering the inclination portions in a boundary between the inclination portions and the molded housing.

9. A semiconductor package in which a leadframe pad to which a semiconductor die is attached and inner leads electrically connected to the leadframe pad are covered by a molded housing, and outer leads extending from the inner leads protrude from a side surface of the molded housing to the outside,
    wherein the outer leads include a first and second lead, wherein at least one of the first and second outer leads is covered by an extended portion of the molded housing where the extended portion is adjacent to the side surface of the molded housing; and
    wherein the second lead has a bent or inclination portion in a region adjacent to the side surface of the molded housing, the bent or inclination portion protruding to increase a space between the first outer lead and the bent or inclination portion in the molded housing; and
    wherein the molded housing is entirely formed on the bent or inclination portion of the second lead, the molded housing formed on the bent or inclination portion having a inner wall on the contour of the bent or inclination portion, an outer wall spaced from the inner wall, and wherein the outer wall between the first and second leads follows the contours of the bent or inclination portion, and an end wall.

10. The semiconductor package of claim 9 wherein the second lead has an inclination portion in which a distance between the first outer lead and the inclination portion becomes larger as a distance between the inclination portion and the side surface of the molded housing becomes smaller.

11. The semiconductor package of claim 9 wherein a depression which is depressed toward a body of the molded housing is formed on the surface of the molded housing between the first outer lead and the second outer lead.

12. The semiconductor package of claim 11 wherein the second lead has a bent portion in a portion where it is adjacent to the side surface of the molded housing, the bent portion protruding to increase a space between the first outer lead and the bent portion in the molded housing.

13. The semiconductor package of claim 11 wherein the second lead includes an inclination portion in which a distance between the first outer lead and the inclination portion becomes larger as a distance between the inclination portion and the side surface of the molded housing becomes smaller.

14. The semiconductor package of claim 9 further including a third lead, wherein the third lead is disposed in a central portion of the molded housing and the first and second outer leads respectively are disposed to the right and left of the third lead.

15. The semiconductor package of claim 14 wherein at least one of the first and second leads has a bent portion in a region where the leads are adjacent to the side surface of the molded housing, the bent portion protruding to increase a space between the first outer lead and the bent portion in the molded housing.

16. The semiconductor package of claim 14 wherein at least one of first and second leads includes an inclination portion in which a distance between the third, central lead and the inclination portion becomes larger as a distance between the inclination portion and the side surface of the molded housing becomes smaller, and wherein the inclination portion is covered by the extended portion of the molded housing.

17. The semiconductor package of claim 16 wherein at least one of the inclination portions of the first and second outer leads includes a portion which is perpendicular to a surface of the molded housing and a flat portion which is larger than a thickness of the molded housing covering the inclination portions in a boundary between the inclination portions and the molded housing.

18. The semiconductor package of claim 14 wherein a depression which is depressed toward a body of the molded housing is formed on at least one of a surface of the molded housing between the first outer lead and the second outer lead and a surface of the molded housing between the first outer lead and the third outer lead.

19. The semiconductor package of claim 18 wherein at least one of the first and second outer leads has a bent portion in a region where it is adjacent to the side surface of the molded housing, the bent portion protruding to increase a space between the third outer lead and the bent portion in the molded housing.

20. The semiconductor package of claim 18 wherein at least one of the first and second leads includes an inclination portion in which a distance between the third outer lead and the inclination portion becomes larger as a distance between the inclination portion and the side surface of the molded housing becomes smaller.

21. The semiconductor package of claim 20 wherein at least one of the inclination portions of the first and second outer leads includes a region which is perpendicular to a surface of the molded housing and a flat portion which is larger than a thickness of the molded housing covering inclination portions in a boundary between the inclination portions and the molded housing.

* * * * *